United States Patent [19]

Speer

[11] Patent Number: 4,626,963
[45] Date of Patent: Dec. 2, 1986

[54] WAVE SOLDERABLE RF SHIELD MEMBER FOR A PRINTED CIRCUIT BOARD

[75] Inventor: Walter F. Speer, Marion County, Ind.

[73] Assignee: RCA Corporation, Princeton, N.J.

[21] Appl. No.: 705,498

[22] Filed: Feb. 28, 1985

[51] Int. Cl.$^4$ .............................................. H05K 5/04
[52] U.S. Cl. .................... 361/424; 174/35 R
[58] Field of Search ............... 29/840, 843; 174/35 R; 228/180.1; 361/424, 400

[56] References Cited

U.S. PATENT DOCUMENTS

| | | | |
|---|---|---|---|
| 4,325,103 | 4/1982 | Ito et al. ................................ | 361/424 |
| 4,404,617 | 9/1983 | Ohyama et al. ...................... | 361/424 |

FOREIGN PATENT DOCUMENTS

| | | | |
|---|---|---|---|
| 0113852 | 7/1984 | European Pat. Off. .......... | 174/35 R |
| 1286165 | 1/1969 | Fed. Rep. of Germany .... | 174/35 R |
| 0937974 | 9/1948 | France .............................. | 174/35 R |
| 2148055 | 9/1984 | United Kingdom . | |

OTHER PUBLICATIONS

Photographs of an ALPS tuner model number CAE 1-002.
Photographs of a Matsushita tuner model number PV 33158 352 from a Ferguson VCR.

*Primary Examiner*—A. D. Pellinen
*Assistant Examiner*—Gregory D. Thompson
*Attorney, Agent, or Firm*—P. J. Rasmussen; P. M. Emanuel; T. F. Lenihan

[57] ABSTRACT

An apparatus is disclosed for wave soldering a printed circuit board having an RF shield member mounted on the component side of the board with tabs extending beyond the electrical conductor side of the printed circuit board. Holes provided in the shield tabs allow the solder wave to pass through the tab to reach contact pads immediately behind the tab and also to reduce splash back and excessive build up of the solder caused by the solder wave striking the tab. Use of the apparatus eliminates costly and time consuming hand soldering operations for the RF shield member.

9 Claims, 1 Drawing Figure

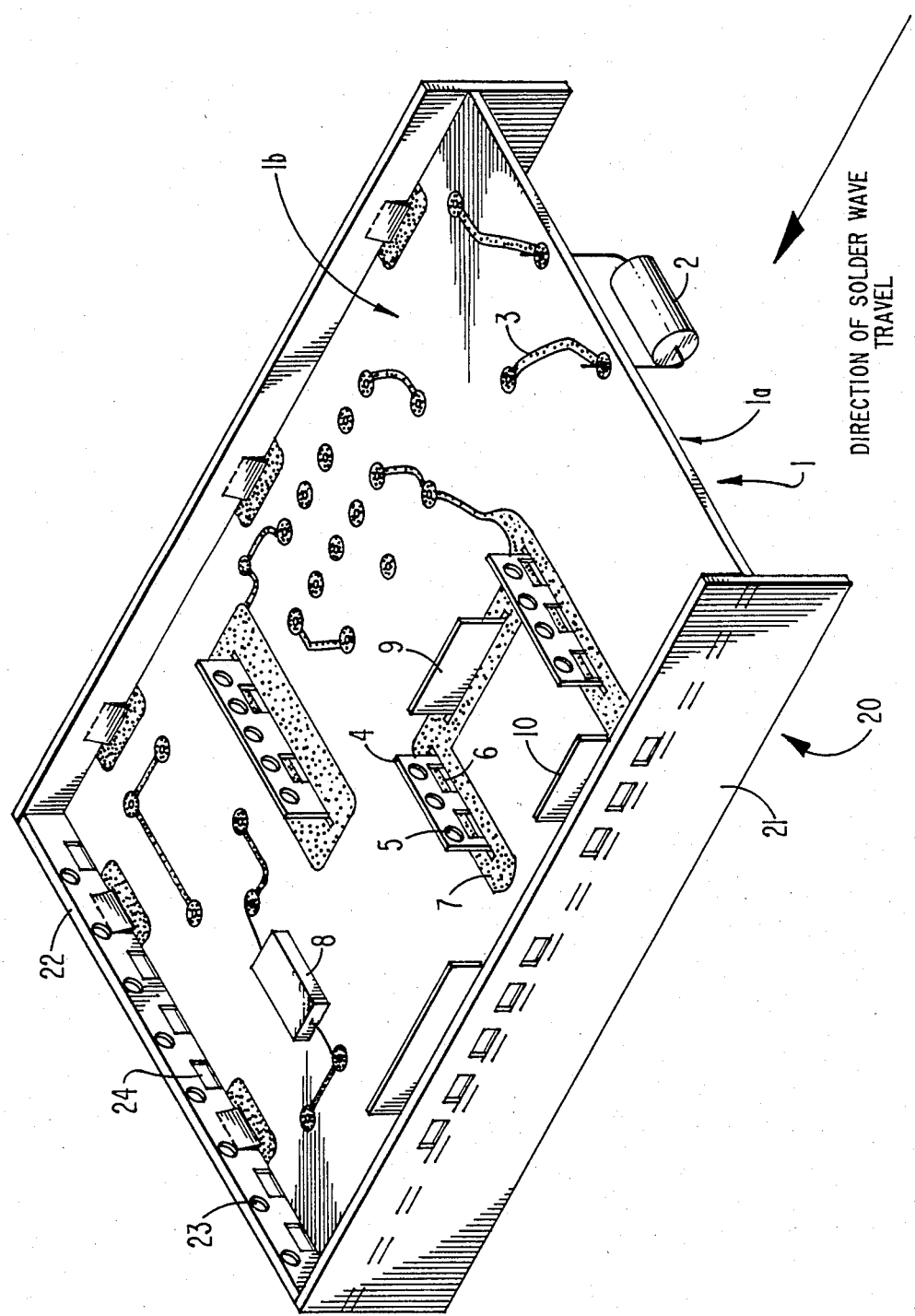

WAVE SOLDERABLE RF SHIELD MEMBER FOR A PRINTED CIRCUIT BOARD

BACKGROUND OF THE INVENTION

This invention relates to the soldering of radio frequency shields to printed circuit boards.

It is often desirable to partition a printed circuit board into separate areas by means of RF shielding members so that RF energy may be contained within, or excluded from, the partioned areas to eliminate the undesirable effects caused by interference due to stray RF signals. Such shielding is used extensively in RF tuners of television receivers. The term "printed circuit board" as used herein refers to circuit boards having electrical conductors formed on one side by deposition, etching or any other process.

Modern television circuit board assemblies are generally manufactured by mounting components on the component side of a printed circuit board with their leads extending through the boards to conductor pads on the conductor side of the board and then wave soldering the leads to the conductor pads on the conductor side of the board and then wave soldering the leads to the conductor pads. Thus all electrical connections between the mounted components and the printed circuit board conductors are accomplished quickly and economically. In addition, wave soldering tends to produce more reliable electrical connections.

RF shields are typically mounted on the component side of the circuit board by passing the tabs of the shield through slots formed in the board. While it is desirable to wave solder the shields to the ground conductor of the board, it has been found that the tabs are obstacles in the path of the solder wave and in some instances produce undesirable splash effects and also tend to block the solder wave from reaching conductor pads immediately behind the tab. Therefore, shield members have typically been hand soldered to the printed circuit board after the wave soldering process. Since the tabs are not present until after the wave soldering operation, they do not interefere with the wave soldering process. This method requires a hand soldering operation for each shield member mounted on the circuit board, a costly and time consuming process.

Another solution to the problem of soldering shield members to printed circuit boards is to form the tabs of the shield such that when the shield is mounted on the printed circuit board the tabs are substantially flush with the surface contacted by the solder wave. This solution has several inherent problems. Since the tabs may no longer provide the friction necessary to hold the shield in place during the soldering process, smaller "holding tabs" are sometimes provided. These holding tabs are inserted through slots in the circuit board and twisted to retain the shield in place. This requires an extra "twisting" step in the mounting process. Perhaps more importantly, the larger tabs form an RF shield on the conductor side of the board. By cutting these tabs flush with the surface of the board the benefits of shielding the critical circuit from the conductor side as well as the component side are lost.

Therefore, it is desirable to provide an apparatus which allows wave soldering of shield members with relatively large tabs intended to extend below the printed circuit board to which the shields are mounted which reduces solder splash effects and the blockage of the solder wave by the tabs.

SUMMARY OF THE INVENTION

According to the principles of the present invention, the tab on a shield member intended to be wave soldered to a printed circuit board has an array of holes allowing solder of a solder wave to pass through it without being significantly impeded. The array of holes is at least partially filled by a solder wave to form a substantially solid shielding structure.

BRIEF DESCRIPTION OF THE DRAWING

The sole FIGURE depicts a printed circuit board and shielding assembly constructed in accordance with the present invention. The assembly is shown upside down to the normal position for wave soldering for clarity.

DESCRIPTION OF THE PREFERRED EMBODIMENT

The assembly includes a printed circuit board 1 partially bounded by an RF shielding enclosure 20. The printed circuit board 1 has a component side 1a on which components, such as component 2, are located and an conductor side 1b on which conductors, such as conductor 3, are formed for interconnecting the components on component side 1a.

A shield partition (not shown), located on component side 1a, has a tab 4 with holes 5 and 6, extends through a slot in the printed circuit board in a conductor area 7. Some components, such as capacitor 8, may be mounted on conductor side 1b of printed circuit board 1.

For wave soldering, the assembly is placed above the surface of the molten solder in a solder bath with conductor side 1b facing the solder. One or more waves are induced in the solder bath to cause the crest of the solder waves to contact the surface of conductor side 1b of printed circuit board 1. The solder waves travel along the length of the assembly in the direction of the arrow. As the solder wave moves, the protruding component leads and shield tabs are soldered to the respective conductor pads and areas.

When the solder wave strikes shield tab 4, for example, the holes 5 and 6 provide a low impedance path for the solder and gases of the solder wave thereby minimizing the tendency of the solder to splash back or to accumulate excessively on tab 4. In addition, the portion of electrical cnductor 7 immediately behind tab 4 will not be blocked by tab 4 from being properly contacted by the solder wave.

The areas of the holes are desirably chosen so that the solder from the solder wave at least partially fills the holes in the RF shield tabs thereby making the tab a substantially solid RF shield for conductor side 1b of board 1. In addition, because the solder is allowed to flow through the holes in the tab and to solidify, it essentially forms a continuous "pin" through the hole which tends to lock the shield to the board. It is felt that the bond created by the use of the integral solder fillet formed by this process is structurally stronger than the bond formed by hand soldering only along the surfaces of the tab as in the prior art.

It is noted that because RF shield tab 9 is positioned parallel to the direction of the movement of the solder wave, it already exhibits a low impedance to the advancing solder wave. Therefore it is not necessary to provide holes in tab 9. However, when an RF shield tab, such as tab 10, is proximate to and parallel to an obstacle such as a wall 21 of shield enclosure 20, excess solder can build up or "bridge" between the wall 21 and the tab 10. Bridging may be eliminated by providing a holes in either or both of wall 21 and tab 10.

Splash back and excessive solder build up can also occur when the solder wave strikes back wall 22 of enclosure 20. Holes 23 and 24 in the back wall 22 provide an exit path for the solder wave and gas thus reducing splash back and excessive solder build up. The holes 23 and 24 are substantially filled by the solder wave to form an essentially solid RF shield enclosure.

It has been found that holes 5 and 23, which are farther from the surface of conduction side 1b, should be larger than holes 6 and 24, proximate to the surface of side 1b, to allow a maximum amount of solder to contact the conductors of board 1. Further it has been found that if holes 5 and 23 are curvilinear, e.g., circular that they fill more completely than if they are oblong, such as rectangular, e.g., as are holes 6 and 24.

Providing two rows of holes through the RF shield tabs, while allowing solder to flow relatively unimpeded, tends to weaken the material in the longitudinal direction. To overcome this problem, the holes 5 and 23 are offset from the holes 6 and 24, respectively, such that the vertical centerlines of the upper holes (5 and 23) fall between the vertical centerlines of the lower holes (6 and 24). This provides sufficient material between the holes to lend structural strength to the tab.

It has been found desirable to use a double wave type of wave soldering equipment and to preheat the assemblies, e.g., by IR radiation, prior to wave soldering.

When the wave soldering operation is complete, a front wall is attached and top and bottom shield covers are put in place to complete the shield enclosure.

An included modification to this process is the wave soldering of a front cover, having an edge substantially flush with the conductor side 1b of circuit board 1, to enclosure 20.

While it has been found that tabs having rectangular holes of 0.1524 cm×0.254 cm in height and length, respectively, and circular holes of 0.23622 cm diameter, produce very good results, RF shielding tabs with other hole shapes and sizes are considered to be within the scope of the invention defined by the following claims.

What is claimed:
1. Apparatus, comprising:
  a printed circuit board having a component side and an electrical conductor side;
  a first RF shield partition mounted on said component side of said printed circuit board substantially perpendicular to the plane of said printed circuit board for shielding circuitry on one side of said first RF shield partition from RF signals generated on the other side of said first RF shield partition; and
  a second RF shield partition mounted on said electrical conductor side of said printed circuit board for shielding circuitry on one side of said second RF shield partition from RF signals generated on the other side of said second RF shield partition, wherein said second RF shield partition comprises a tab of said first RF shield partition extending beyond said electrical conductor side of said printed circuit board, said second RF shield partition having an array of holes allowing solder of a solder wave to pass through said second RF shield partition without being substantially impeded thereby, said array of holes being at least partially filled by solder of said solder wave to form a substantially solid RF shield structure, and said second RF shield partition being soldered to one of said electrical conductors by said solder wave.

2. Apparatus according to claim 1 wherein said first RF shield partition is mounted on said printed circuit board and said second RF shield partition extends through a slot in said printed circuit board.

3. Apparatus according to claim 1 wherein said first and second RF shield partitions are mounted along an edge of said printed circuit board to form a portion of a shield enclosure for said printed circuit board.

4. Apparatus according to claim 1 wherein said array of holes in said second RF shield partition comprises a first row of holes proximate to said printed circuit board and a second row of holes farther from said printed circuit board than said first row, said first and second rows being substantially parallel to the plane of said printed circuit board.

5. Apparatus according to claim 4 wherein said holes in said first row of holes are substantially oblong.

6. Apparatus according to claim 4 wherein said holes in said second row of holes are substantially circular.

7. Apparatus according to claim 4 wherein said holes in said first row are rectangular and said holes in said second row are curvilinear.

8. Apparatus according to claim 4, wherein at least some of the holes of said first and second rows of holes are offset horizontally such that the vertical center lines of the holes of said first row fall between the vertical center lines of the holes of said second row thereby providing a greater structural integrity than if said rows were not offset.

9. Apparatus according to claim 1 wherein said second RF shield partition is parallel to and proximate to an obstacle to said wave, said array of holes inhibiting the bridging of solder between said second RF shield partition and said obstacle.

* * * * *